United States Patent

Honda et al.

[11] Patent Number: 5,891,758
[45] Date of Patent: Apr. 6, 1999

[54] SEMICONDUCTOR DEVICE AND METHOD FOR MANUFACTURING SEMICONDUCTOR DEVICE

[75] Inventors: Toshiyuki Honda; Akihiro Oku; Takanori Watanabe; Kazuto Tsuji; Yoshiyuki Yoneda, all of Kawasaki, Japan

[73] Assignee: Fujitsu Limited, Ltd., Kawasaki, Japan

[21] Appl. No.: 962,395

[22] Filed: Oct. 31, 1997

[30] Foreign Application Priority Data

Jun. 10, 1997 [JP] Japan ..................................... 9-152678

[51] Int. Cl.$^6$ ........................... H01L 21/44; H01L 21/48; H01L 21/50
[52] U.S. Cl. ........................... 438/118; 29/854; 257/687; 257/690; 174/52.4
[58] Field of Search ............................... 438/118; 29/854; 257/687, 690; 174/52.4

[56] References Cited

U.S. PATENT DOCUMENTS 5,298,460  3/1994  Nishiguchi et al. ..................... 437/183
5,656,550  8/1997  Tsuji et al. ............................... 438/123

*Primary Examiner*—Richard A Booth
*Assistant Examiner*—Josetta I. Jones
*Attorney, Agent, or Firm*—Armstrong, Westerman, Hattori, McLeland, & Naughton

[57] ABSTRACT

A method of manufacturing a semiconductor device includes the steps of: mounting a semiconductor chip on a holding board having electrode accommodation recesses formed thereon, and mounting electrode members to the electrode accommodation recesses, the electrode members being formed separately from the semiconductor element; electrically connecting electrode pads formed on the semiconductor chip with the electrode members; forming a resin package for sealing the semiconductor chip on the holding board by using a die, the holding board serving as a part of the die; and separating the resin package including the electrode members from the holding board. A semiconductor device includes: a semiconductor chip; a resin package for sealing the semiconductor chip; electrode members which are embedded in and held by the resin package and which are partly exposed from a mounting surface so as to form external connection terminals; and connecting parts electrically connecting electrode pads on the semiconductor chip with the electrode members.

16 Claims, 12 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention generally relates to a semiconductor device and a method for manufacturing a semiconductor device, and particularly relates to a semiconductor device of the leadless surface mounted type and a resin sealed type and a method for manufacturing such semiconductor device.

The pitch of the leads which are provided to a semiconductor of the resin sealed type needs to be ever smaller to achieve further miniaturization of electronic devices. Therefore, for the semiconductor device of the resin sealed type, new structures and manufacturing methods are required.

2. Description of the Related Art

FIGS. 1A–1C and FIG. 2 show cross-sectional diagrams of conventional resin sealed semiconductor devices.

In FIGS. 1A–1C, a semiconductor device includes a resin 1, a semiconductor chip 2, outer leads 3, bonding wires 4 and a die pad 5. This semiconductor device is of a package structure referred to as SSOP (Shrink Small Outline Package) wherein the outer leads 3 bent in a gull-wing shape are mounted to a carrying board.

In FIG. 2, a semiconductor device includes the resin 1, the semiconductor chip 2, the bonding wires 4, solder balls 6 and a carrying board 7 for mounting the semiconductor chip 2. This semiconductor device is of a package structure referred to as BGA (Ball Grid Array) wherein terminal parts to be mounted to a carrying board are formed of the solder balls 6.

In the SSOP-type semiconductor device shown in FIG. 1, the area of a connecting part 9 ranging from the inner leads 8 to the outer leads 3, shown in resin 1, and/or the area occupied by the outer leads 3 is large, so that a problem arises in that the device occupies a large area when it is mounted on a board. Also, in the BGA-type semiconductor device shown in FIG. 2, the manufacturing cost increases due to the use of the carrying board 7.

A semiconductor device which could overcome the above-mentioned problems is described in Japanese Patent Application No.7-322803. FIG. 3 shows a semiconductor device 110 disclosed in the above application. As shown in FIG. 3, the semiconductor device 110 has a very simple structure including a semiconductor chip 111, a resin package 112 and metal layers 113. The semiconductor device 110 is characterized in that resin protrusions 117 formed as part of the mounting surface 116 of the resin package 112 are coated with the metal layers 113.

In the semiconductor device 110 constructed as described above, no inner lead or outer lead, as used in a conventional SSOP, is necessary. Therefore, the connecting area from inner leads to outer leads and the area occupied by the outer leads become unnecessary, so that the semiconductor device 110 is miniaturized. Also, the manufacturing cost of the semiconductor device 110 is reduced since there is no need for using the carrying board to form solder balls, as were necessary in conventional BGA. In addition, the resin protrusions 117 and the metal layers 113 together provide a function equivalent to that of solder bumps (protruded electrode) of the semiconductor device of the BGA type. This makes it easier to mount the semiconductor device.

As described above, the semiconductor device 110 can bring about various advantageous effects which were not obtained by semiconductor devices of the prior art shown in FIG. 1 and in FIG. 2.

However, the semiconductor device 110 has a structure in which the metal layers 113 are simply disposed to cover the resin protrusions 117. At junction parts between the metal layers and the resin protrusions 117, it is difficult to maintain a sufficient joining force. There were problems such that for example during the semiconductor manufacturing process or when mounting, the metal layers 113 peel off from the resin protrusions 117 and reliability of the semiconductor device 110 may decrease.

Accordingly, there is a need for a semiconductor device and a method of manufacturing a semiconductor device which overcomes the above problems. Also, there is a need for a semiconductor device in which reliability is improved by firmly joining the metal layers and the resin protrusions and a method of manufacturing such semiconductor device.

SUMMARY OF THE INVENTION

Accordingly, it is a general object of the present invention to provide a semiconductor device and a method of manufacturing a semiconductor device which can satisfy the needs described above.

It is another object of the present invention to provide a method of manufacturing a semiconductor device which can surely separate the electrode members from the holding board when separating the resin package from the holding board in a separating process, and can prevent the electrode members from remaining in the holding board. Also, the electrode members are embedded in the resin package so that the electrode members are firmly held to the resin package. Because of this, the electrode members will not separate from the resin package and the reliability of the semiconductor device is improved.

In order to achieve the above object according to the present invention, a method of manufacturing a semiconductor device includes the steps of:

a) mounting a semiconductor chip on a holding board having electrode accommodation recesses formed thereon, and mounting electrode members to the electrode accommodation recesses, the electrode members being formed separately from the semiconductor element;

b) electrically connecting electrode pads formed on the semiconductor chip with the electrode members;

c) forming a resin package for sealing the semiconductor chip on the holding board by using a die, the holding board serving as a part of the die; and d) separating the resin package including the electrode members from the holding board.

In the method described above, the electrode members are formed separately from the semiconductor element and the electrode members are mounted to the electrode accommodation recesses in step a). Therefore, the joining force between the electrode members and the electrode accommodation recesses is smaller compared to the joining force of the conventional structure (see FIG. 21) wherein the metal layers 113 are joined to the resin protrusion 117 by plating.

It is still another object according to the present invention to provide a method of manufacturing a semiconductor device which can reduce the number of components and the number of manufacturing steps by not utilizing an adhesion agent, while the semiconductor chip and the electrode members are easily held to the holding board.

In order to achieve the above object according to the present invention, a method of manufacturing a semiconductor device includes the step a) which further includes the steps of:

forming an element accommodation recess together with the electrode accommodation recesses on the holding board for carrying the semiconductor chip; and mounting the semiconductor chip on the element accommodation recess so that the holding board holds the semiconductor chip.

In the method described above, said semiconductor chip is mounted on said element accommodation recess so that said semiconductor chip holds said holding board. Therefore, the number of components and the number of manufacturing steps are reduce by not utilizing an adhesion agent.

It is yet another object of the present invention to provide a method of manufacturing a semiconductor device which can securely hold the semiconductor chip to the holding board by holding the semiconductor chip 11 on the holding board using a tape member which functions as an adhesive member in the step a).

In order to achieve the above object according to the present invention, a method of manufacturing a semiconductor device includes the step a) further including the steps of:

providing an adhesion member having adhesiveness to the holding board at a position where the semiconductor chip is to be mounted; and holding said semiconductor chip on said holding board by said adhesion member.

It is yet another object of the present invention to provide a method of manufacturing a semiconductor device which can surely prevent the semiconductor chip and the mounting board from being short-circuited and to prevent the semiconductor chip from separating from the resin package, thereby improving the reliability of the semiconductor device.

In order to achieve the above object according to the present invention, a method of manufacturing a semiconductor device includes an area of the adhesive member which is smaller than an area of the semiconductor chip.

In the method described above, by providing the adhesive member in the step a), a semiconductor chip can be mounted on the holding board apart from the surface of the holding board with a distance of the thickness of the adhesive member. Also, the area of the tape member is smaller than the area of the semiconductor chip. Therefore a space can be formed between the base of the semiconductor chip and the surface of the holding board.

It is yet another object of the present invention to provide a method of manufacturing a semiconductor device which can reduce the risk of impurities entering between the semiconductor chip and the electrode members and the holding board. This can decrease contamination, and reliability of the semiconductor device is improved. Also, a boundary surface between the foreign matter and the semiconductor element and the electrode members can be reduced, so that peeling and/or cracking due to thermal stress at the boundary surface can be reduced. This can also improve reliability of the semiconductor device.

In order to achieve the above object according to the present invention, a method of manufacturing a semiconductor device includes a step of forming suction holes in the holding board so that both of the step b) and the step c) are performed while the semiconductor chip and the electrode members are held to the holding board by suction force.

In the method described above, holding can be achieved without using extra material for holding the semiconductor chip and the electrode members (such as holders, herein referred to as foreign matter), by performing the step b) and the step c) with the semiconductor chip and the electrode members are held by vacuum to the holding board, thereby achieving the above object.

It is yet another object of the present invention to provide a method of manufacturing a semiconductor device which can form plating layers easily without damaging the resin package, compared to a method wherein a plating process is performed after forming the resin package.

In order to achieve the above object according to the present invention, a method of manufacturing a semiconductor device performs a plating process for at least partly forming plating layers on the electrode members, before performing the step a).

It is yet another object of the present invention to provide a method of manufacturing a semiconductor device which can surely separate the electrode members from the holding board even in the case when the sealing resin enters between the electrode members and the electrode accommodation recesses.

In order to achieve the above object according to the present invention, a method of manufacturing a semiconductor device includes the plating layers formed in said plating process which are made of gold.

In the method described above, the gold layers have less adhesiveness to the resin sealing, there by achieving the above object.

It is yet another object of the present invention to provide a method of manufacturing a semiconductor device which can perform the step a) of the semiconductor device quite easily by using solder as the plating layers, so that the semiconductor device can be soldered to the mounting board.

In order to achieve the above object according to the present invention, a method of manufacturing a semiconductor device includes forming the plating layers in the plating process of solder.

It is yet another object of the present invention to provide a method of manufacturing a semiconductor device which can easily and surely separate the resin package from the holding board, even in the case when the resin package is formed on the holding board in the step c), since the joining force between the holding board and the resin package is weak.

In order to achieve the above object according to the present invention, a method of manufacturing a semiconductor device further includes a step of applying, before performing the step a), a demolding agent to a portion of said holding board where said holding board comes in contact with the resin package for weakening adhesiveness against the resin of said resin package and includes gold plating applied to a portion of said holding board where said holding board comes in contact with the resin package.

In the method described above, the demolding agent for weakening adhesiveness with the sealing resin or the gold layer is provided to the part of the holding board which contacts the resin package. Therefore the joining force between the holding board and the resin package is weak.

It is yet another object of the present invention to provide a method of manufacturing a semiconductor device in which a space is formed between the base of the semiconductor chip and a mounting board when the semiconductor device is mounted on the mounting board, so that the semiconductor chip and the mounting board are prevent from being short-circuited.

In order to achieve the above object according to the present invention, a method of manufacturing a semiconductor device which includes the holding board is such that a depth of the electrode accommodation recesses is larger than a depth of the element accommodation recess.

In the method described above, the electrode members will have a larger degree of protrusion with respect to the mounting surface (the base) of the resin than that of the semiconductor chip, thereby achieving the above object.

It is yet another object of the present invention to provide a method of manufacturing a semiconductor device, which can form the electrode members having larger thickness, more easily within a short period of time as compared to the conventional structure wherein the metal layers are formed by plating.

In order to achieve the above object according to the present invention, a method of manufacturing a semiconductor device includes an electrode member forming process which is performed before performing the step a), and in which the electrode members preformed by cutting out a metal plate.

It is yet another object of the present invention to provide a method of manufacturing a semiconductor device which can be treated in a similar manner to the way the BGA (Ball Grid Array) is treated, so that it is easier to mount and a multi-pin structure is achieved.

In order to achieve the above object according to the present invention, a method of manufacturing a semiconductor device includes the electrode members used in the step a) including one of solder balls and gold balls.

It is yet another object of the present invention to provide a method of manufacturing a semiconductor device which can achieve a fine-pitch structure and a multi-pin structure by enabling multi-stage bonding, so that neighboring wires are prevented from touching each other.

In order to achieve the above object according to the present invention, a method of manufacturing a semiconductor device includes the electrode members having different heights which are mounted in the step a), so that connecting performed in the step b) can be performed at different heights.

It is yet another object of the present invention to provide a method of manufacturing a semiconductor device which can prevent the sealing resin from entering between the electrode members and the electrode accommodation recesses, thereby surely separate the electrode members from the holding plate in the separating process.

In order to achieve the above object according to the present invention, a method of manufacturing a semiconductor device includes the electrode members and the electrode accommodation recesses which are stuck together when the electrode members are mounted on the electrode accommodation recesses in the step a).

It is yet another object of the present invention to provide a semiconductor device which can prevent the electrode members from separating from the resin package while mounting the semiconductor device on a mounting board, thereby improving the reliability of the semiconductor device.

In order to achieve the above object according to the present invention, a semiconductor device includes:

a semiconductor chip;

a resin package for sealing the semiconductor chip;

electrode members which are embedded in and held by the resin package and which are partly exposed from a mounting surface so as to form external connection terminals; and connecting parts electrically connecting electrode pads on the semiconductor chip with the electrode members.

It is yet another object of the present invention to provide a semiconductor device which can surely prevent the semiconductor chip and the mounting board from being short-circuited and to prevent the semiconductor chip from separating from the resin package thereby improving the reliability of the semiconductor device.

In order to achieve the above object according to the present invention, a semiconductor device further includes a spacer on a lower surface of the semiconductor chip, the spacer having an area smaller than an area of the semiconductor device, and a sealing resin forming the resin package surrounds the spacer.

It is yet another object of the present invention to provide a semiconductor device which can carry out an operational test for the semiconductor device after the semiconductor device is mounted on the mounting board by touching the extended part with a probe.

In order to achieve the above object according to the present invention, a semiconductor device includes the electrode members which are extended outside an outer edge of the resin package.

It is yet another object of the present invention to provide a semiconductor device which can enable multi-stage bonding and can narrow the pitch between respective electrode members, so that the semiconductor device can be of multi-pin structure.

In order to achieve the above object according to the present invention, a semiconductor device includes the electrode members which include high-back electrode members and low-back electrode members having a height lower than a height of the high-back electrode members.

It is yet another object of the present invention to provide a semiconductor device which can be treated in a similar manner to the way the BGA (Ball Grid Array) is treated, so that it is easier to mount and a multi-pin structure is achieved.

In order to achieve the above object according to the present invention, a semiconductor device includes the electrode members which are formed of metal balls.

Other objects and further feature of the present invention will be apparent from the following detailed description when read in conjunction with the accompanying drawings.

DESCRIPTION OF THE PREFERRED EMBODIMENTS

In the following, a principle and embodiments of the present invention will be described with reference to the accompanying drawings.

Figure 1C:
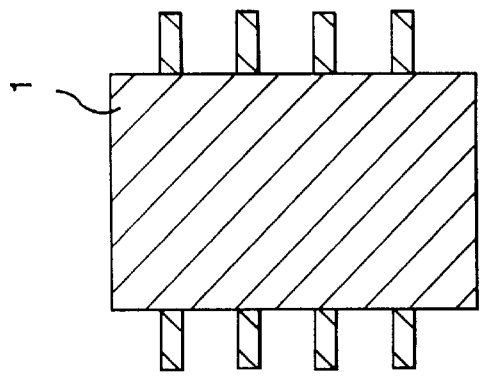
FIGS. 1A–1C are schematic diagrams showing an example of a semiconductor device of the prior art.
Figure 1B:
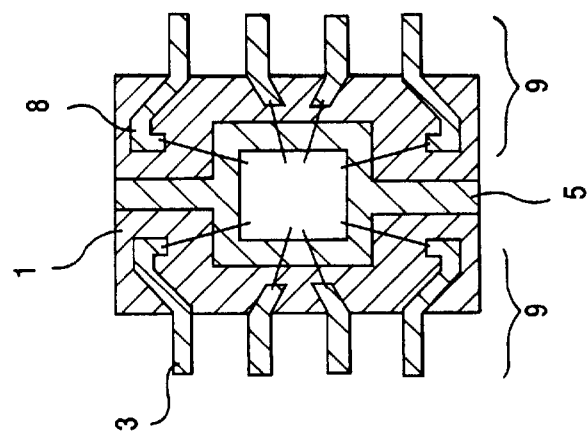
Figure 1A:
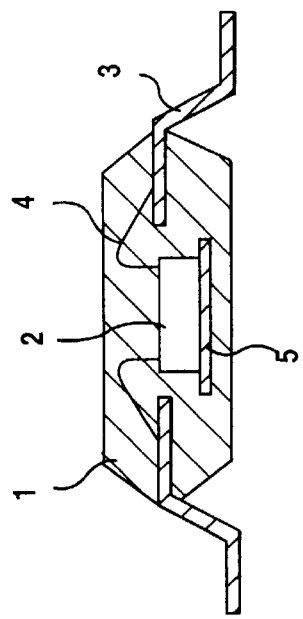
Figure 2:
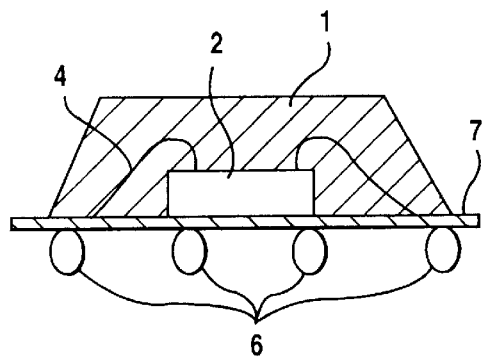
FIG. 2 is a schematic diagram showing an example of a semiconductor device of the prior art.
Figure 3:
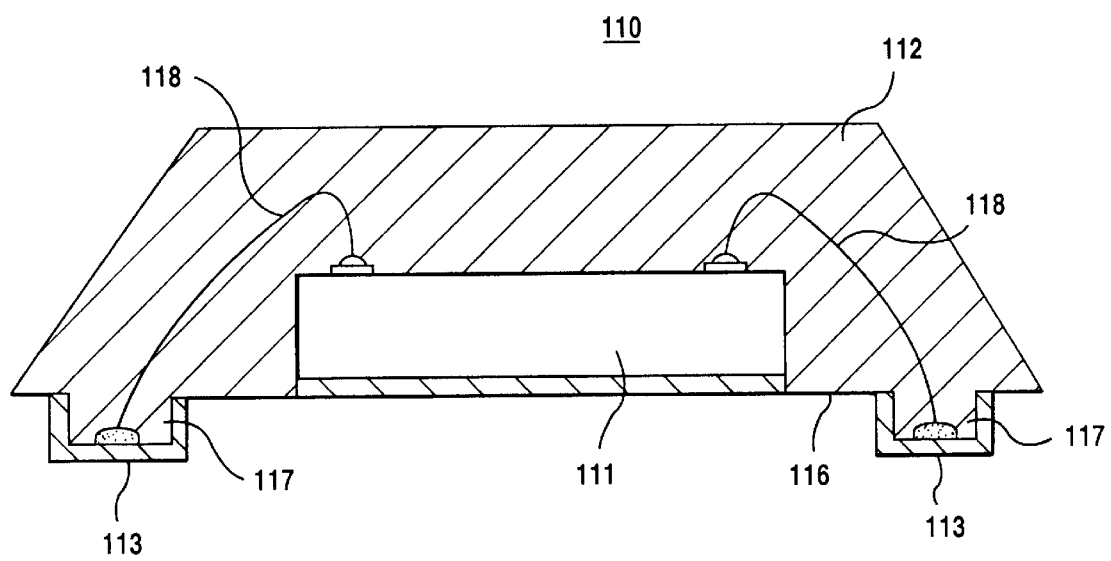
FIG. 3 is a schematic diagram showing an example of a semiconductor device of the prior art.
Figure 4:
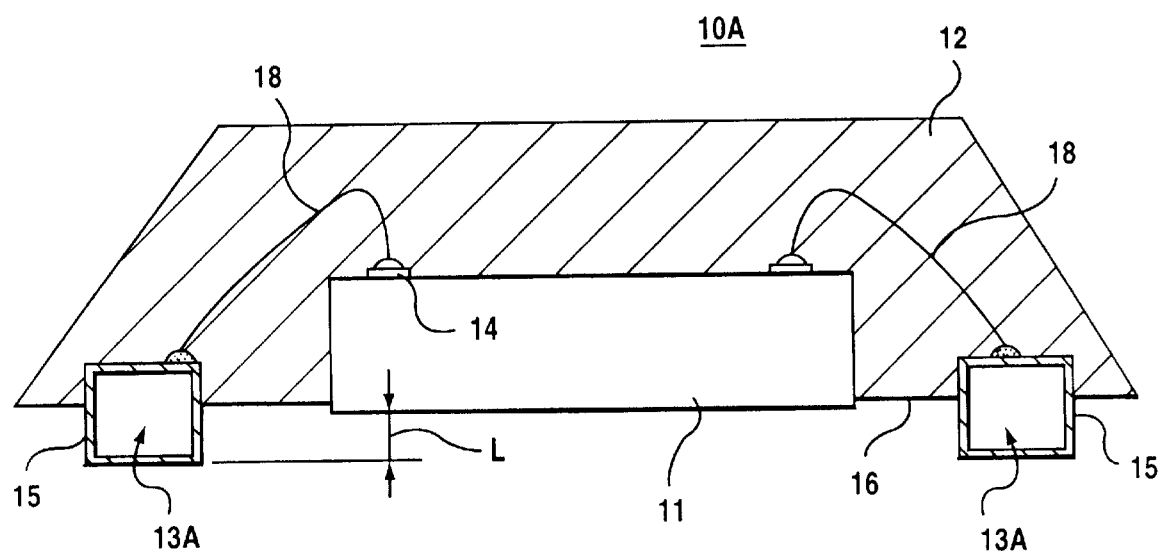
FIG. 4 is a cross sectional diagram of a first embodiment of a semiconductor device of the present invention.

FIG. 4 is a cross sectional diagram of a semiconductor device 10A which is a first embodiment of a semiconductor device of the present invention. In general, the semiconductor device 10A includes a semiconductor chip 11, a resin package 12 and electrode members 13A. Therefore the structure of this semiconductor device is quite simple.

A plurality of electrode pads 14 are formed on the upper surface of the semiconductor device 11. The resin package 12 is formed, for example, by molding (or potting) epoxy resin as will be later described.

The electrode members 13A, which are cut out of a lead frame material such as copper alloy, serve as external connection terminals. These electrode members 13A are partly embedded in the resin package 12. Thus, the electrode members 13A are firmly held to the resin package in this embedded structure, so that they will not easily separate from the resin package 12. Therefore the electrode members 13A will not separate from the resin package 12 while mounting the semiconductor device 10A on a mounting board. This improves the reliability of the semiconductor device.

Wires 18 are provided between the electrode members 13A and the above-mentioned electrode pads 14, thus making the electrode members 13A and the semiconductor device 10A electrically connected. In the present embodiment, wire-bonding is used as parts connecting the electrode members 13A with the electrode pads 14. However, connection of the electrode members 13A with the electrode pads 14 is not limited to wire-bonding and, for example, TAB (Tape Automated Bonding) or flip-chip bonding can also be employed. When using flip-chip bonding, bumps can be provided either on the electrode members 13A or on the electrode pads 14 of the semiconductor chip 11.

In the present embodiment, plating layers 15 are formed on the electrode members 13A. These plating layers 15 may be made either of gold or of solder. If gold is used as the plating layers 15, the electrode members 13A are surely protected while electric connection with the mounting surface is improved. If solder is used as the plating layers 15, the semiconductor device 10A can be soldered to the mounting board (not shown) by means of the plating layers 15. Therefore, the mounting process of the semiconductor device 10A can be performed quite easily.

The plating layers 15 need not be formed on the entire electrode members 13A, but may be formed at least on the parts exposed from the resin package 12. Also, the structure of the plating layers 15 is not limited to a single-layer structure, but can also be a multi-layer structure so as to correspond to the mounting configuration of the semiconductor device 10A.

In the semiconductor device 10A having the structure as described above, inner-leads and outer-leads of the conventional SSOP are no longer necessary, and the area for connecting inner leads with outer leads or the area of an outer leads also becomes unnecessary, thereby miniaturizing the semiconductor device 10A.

The mounting board, which was necessary in the conventional BGA, for forming solder balls is not required. Because of this, manufacturing cost of the semiconductor device 10A is reduced. Also, it is easier to mount the electrode members 13A since the electrode members 13A are equivalent to bumps (protruded electrodes) of a BGA-type semiconductor device.

In the semiconductor device 10A according to the above embodiment, the electrode members 13A were formed by cutting out part of the lead-frame material. However, metal balls can be used as the electrode members 13A. These metal balls can either be gold balls or solder balls. In a semiconductor device using these metal balls as the electrode members 13A, the electrode members 13A are spherical. Therefore this semiconductor device can be treated in a similar manner to the way the BGA (Ball Grid Array) is treated, so that it is easier to mount and a multi-pin structure is achieved.

The manufacturing method of the semiconductor device according to the above first embodiment will be described with reference to FIGS. 5–9. In general, the manufacturing method of the semiconductor device according to the present invention includes mounting process, connecting process, sealing process and separating process. Each process will be described in detail.

Figure 5:
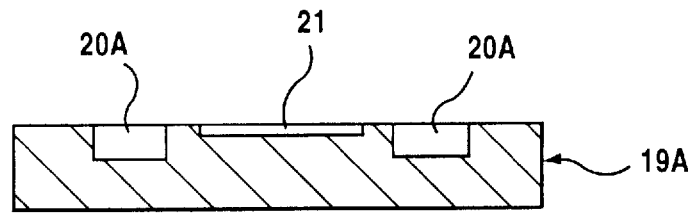
FIG. 5 is a schematic diagram showing a mounting process of a manufacturing method of a first embodiment of a semiconductor device of the present invention.

First, the mounting process will be described with reference to FIG. 5 and FIG. 6. In the mounting process, a holding board 19A having electrode accommodation recesses 26A formed thereon is used so as to mount a semiconductor chip 11 on the holding board 19A and to mount electrode members 13A to the electrode accommodation recesses 20A.

The holding board 19A is formed of metal which has coefficient of thermal expansion is close to that of the semiconductor chip 11 and the electrode member 13A. As shown in FIG. 5, a plurality of the electrode accommodation recesses 20A is formed such that they surround an element accommodation recess 21. The depth of the electrode accommodation recesses 20A is deeper than the depth of the element accommodation recess 21. Also, the plane configuration of the element accommodation recess 21 is constructed so as to match the base configuration of the semiconductor chip 11, while the plane configuration of the electrode accommodation recesses 20A is constructed so as to match the base configuration of the electrode members 13A.

Either cutting work (machining) or etching can be employed as a method of forming the element accommodation recess 21 and the electrode accommodation recesses 20A on the holding board 19A.

In the sealing process described in the following, the resin package 12 is formed on the upper surface of this holding board 19A. On the predetermined part where the resin package is formed on the holding board 19A, a demolding agent (not shown) having low joining ability with a sealing resin 25 (the resin package 12) is spread, or a gold layer is formed. Also, at least on the inner surface of the electrode accommodation recesses 20A, gold plating is deposited.

Figure 6:
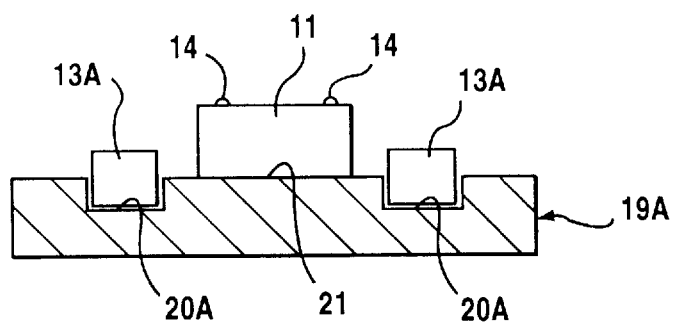
FIG. 6 is another schematic diagram showing a mounting process of a manufacturing method of a first embodiment of a semiconductor device of the present invention.
Figure 7:
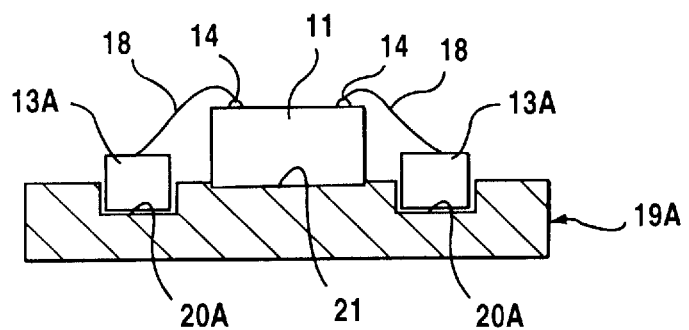
FIG. 7 a schematic diagram showing a connecting process of a manufacturing method of a first embodiment of a semiconductor device of the present invention.

As shown in FIG. 6, the semiconductor chip 11 and the electrode member 13A are mounted on the holding board 19A having the above structure. This mounting process merely mounts the semiconductor chip 11 on the element accommodation recess 21 and also mounts the electrode members 13A to the electrode accommodation recesses 20A.

During this process, no adhesive agent is spread on the element accommodation recess 21 and on the electrode accommodation recesses 20A. The semiconductor chip 11 and the electrode member 13A are held to the holding board 19A simply by the fitting of the semiconductor chip 11 and the element accommodation recess 21 and by the fitting of the electrode members 13A and the electrode accommodation recesses 20A. Therefore the number of components and the number of manufacturing steps is reduced by not utilizing an adhesion agent, while the semiconductor chip 11 and the electrode members 13A are easily held to the holding board 19A.

The semiconductor chip 11 and the electrode members 13A are formed in advance by another process. The electrode members 13A are formed by an electrode member forming process and plating process which are performed prior to the mounting process.

In the electrode member forming process, a lead-frame plate, which may be made of copper alloy, is subjected to pressing/punching work so as to cut out individual electrode member 13A. The electrode members 13A are thus formed by cutting out the lead-frame plate the in the electrode member forming process. The electrode members 13A are formed more easily and more efficiently compared to the conventional structure wherein the metal layers 113 are formed by plating.

Changing the height of the electrode members 13A does not affect the efficiency in forming the electrodes since the height of the electrode members 13A is defined by the thickness of the lead-frame plate. Plating the electrodes can be performed after a sealing process, which is described below, is completed.

However, when the plating process is performed after the completion of the sealing process, a formed resin package 12 may be damaged by plating liquid. Therefore, to form plating layers 15 without damaging the resin package 12, the plating process is performed before the mounting process and the plating layers 15 are at least partly formed on the electrode members 13A in advance.

The electrode members 13A, which have been cut out as described above, are subsequently subjected to a plating process. In the plating process, the plating layers 15 (see FIG. 4) are at least partly formed on the electrode members 13A. The plating layers 15 can be made of gold or of solder. The effect of using gold and the effect of using solder as the plating layers 15 has been previously described, and further description will be omitted.

After completion of the mounting process, the connecting process is performed. This connecting process will be describe with reference to FIG. 7. In the connecting process, the electrode pads 14 which are formed on the semiconductor chip 11 and the electrode members 13A are electrically connected.

In the present embodiment, the wires 18 are used for electrically connecting the electrode pads 14 with the electrode members 13A, and wire-bonding is employed as a means for providing these wires 18. As described above, means for connecting the electrode pads 14 with the electrode members 13A is not limited to wire-bonding, but TAB (Tape Automated Bonding) or flip-chip bonding may also be used. Particularly when flip-chip bonding is used, the bumps may either be provided on the electrode members 13A or on the electrode pads 14 of the semiconductor chip 11.

After completion of the connecting process, the sealing process is performed. This sealing process will be describe with reference to FIG. 8. In the sealing process, the holding board 19A is used as a part of a mold, and the resin package 12, which seals the semiconductor chip 11 on the holding board 19A, is formed.

The resin package 12 is formed by mounting the holding board 19A, which is provided with the semiconductor element 11, the electrode members 13A and the wires 18, in the mold 22A. This mold 22A consists of an upper-mold 23 and a lower-mold 24, and the holding board 19A is held between the upper-mold 23 and the lower-mold 24.

In the upper-mold 23, a cavity 26 which matches the resin package 12 is formed as well as a gate 33 through which the sealing resin 25 which will be the resin package 12 is filled. On the contrary, the lower-mold 24 has a flat upper surface since the lower-mold 24 mounts the holding board 19A which functions as a part of the mold. Therefore the structure of the lower-mold 24 is simplified, thereby reducing the cost of the mold 22A.

Figure 8:
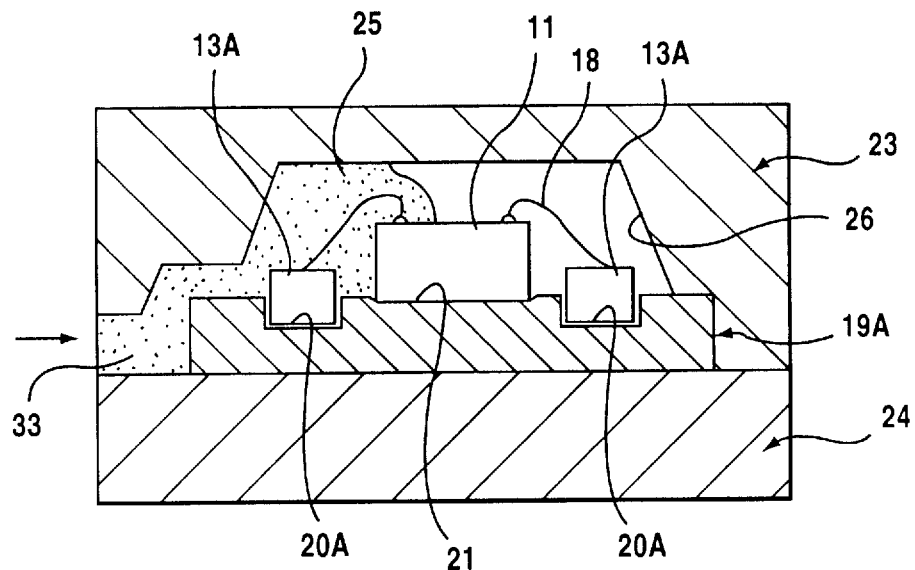
FIG. 8 a schematic diagram showing a sealing process of a manufacturing method of a first embodiment of a semiconductor device of the present invention.
Figure 9:
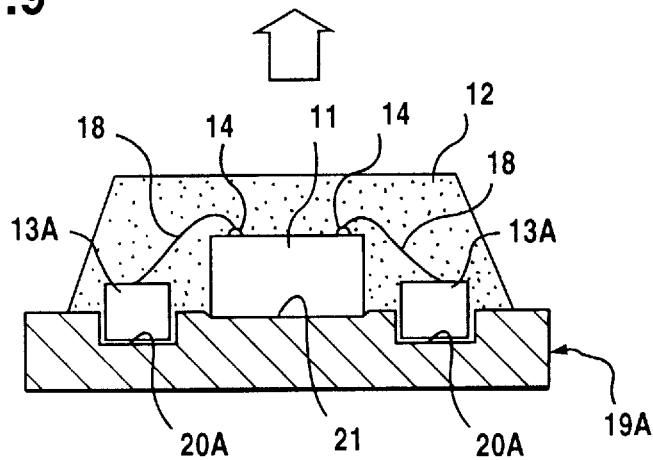
FIG. 9 a schematic diagram showing a separating process of a manufacturing method of a first embodiment of a semiconductor device of the present invention.

As described above, after the holding board 19A is mounted in the mold 22A, the sealing resin 25 (shown as dotted area) is filled into the cavity 26 through the gate 33. In the present embodiment, molding is used as an example for forming the resin package 12, but potting may also be used. FIG. 8 shows a structure wherein the resin package 12 is formed for a single semiconductor chip 11. However, it may be of a so-called multi-cavity structure, where a plurality of the semiconductor chips 11 and the electrode members 13 may be formed on the holding board 19A and at the same time a plurality if the cavities 26 may be formed on the mold 22A.

After completion of the sealing process, the separating process is performed. This separating process will be describe with reference to FIG. 9. In the separating process, the resin package 12 separates from the holding board 19A together with the electrode members 13A.

In the present embodiment, a method is described wherein the resin package 12 separates from the holding board 19A together with the electrode members 13A by pulling out (in the direction of an array) the resin package 12 from the holding board 19A. If the joining force between the holding board 19A and the resin package 12 is large and/or the joining force between the electrode accommodation recesses 20A and the electrode members 13A is large, the resin package 12 may crack during separation, or the electrode members 13A may remain on the holding board 19A.

However, as described above, the joining force between the electrode accommodation recesses 20A and the electrode members 13A is comparatively small, since the structure is such that the electrode accommodation recesses 20A and the electrode members 13A are simply fitted together. Also, the joining force between the electrode members 13A and the resin package 12 is large, since the electrode members 13A are embedded in the resin package.

In the sealing process, when the sealing resin 25 enters between the electrode members 13A and the electrode accommodation recesses 20A, this sealing resin 25 is equivalent to the adhesive agent for joining the electrode members 13A and the electrode accommodation recesses 20A. In this case, the electrode members 13A may not separate from the electrode accommodation recesses 20A. However, in the present embodiment, the plating layers 15 (see FIG. 4), whose adhesiveness with the resin is lower than that of gold, are formed on the surface of the electrode members 13A and the gold layers are formed on the inside of the electrode accommodation recesses 20A.

Because of this, when separating the resin package 12 from the holding board 19A in the separating process, the electrode members 13A surely separate from the holding board 19A and the electrode members 13A are prevented from remaining in the holding board 19A.

In the present embodiment, before performing the mounting process as described above, the demolding agent for weakening adhesiveness with the sealing resin 25 (resin package 12) or the gold layer is provided to the part of the holding board 19A which contacts the resin package 12. Therefore the joining force between the holding board 19A and the resin package 12 is weak. Because of this, the resin package 12 surely separates from the holding board 19A without damaging the resin package 12 during the separating process.

The semiconductor device 10 shown in FIG. 4 is manufactured by performing a series of processes described above. In the manufacturing method according to the present embodiment, a lead-cutting process and a lead-forming process for forming the leads into a predetermined shape (for example gull-wing shape) are not required. This simplifies the manufacturing of the semiconductor device 10A.

Also in the present embodiment, the holding board 19A is used, which has a structure such that the depth of the electrode accommodation recesses 20A is deeper than the depth of the element accommodation recess 21. Therefore in the manufactured semiconductor device 10A, the electrode members 13A will have a larger degree of protrusion with respect to the mounting surface 16 of the resin 12 than that of the semiconductor chip 11. Accordingly, a space (indicated by an arrow L in FIG. 4) is formed between the base of the semiconductor chip 11 and a mounting board (not shown) when the semiconductor device 10A is mounted on the mounting board. Because of this, the semiconductor chip 11 and the mounting board are surely prevented from being short-circuited.

Figure 10:
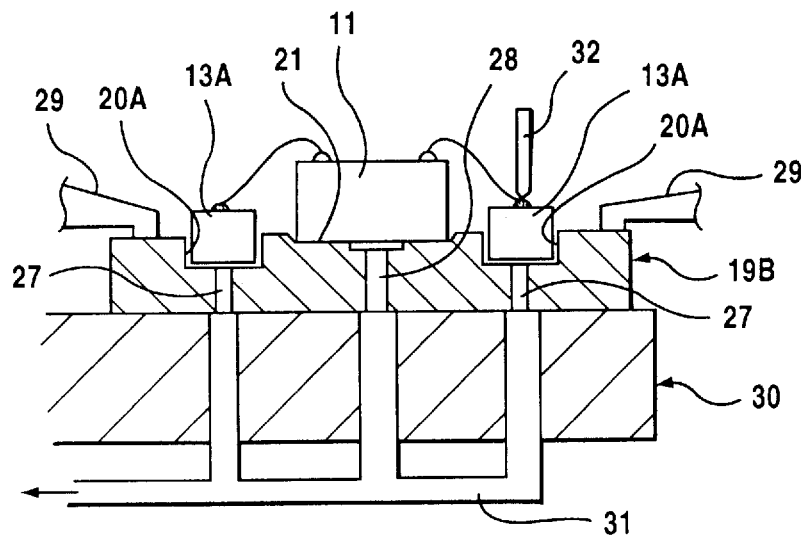
FIG. 10 is a schematic diagram showing a variant of the connecting process.
Figure 11:
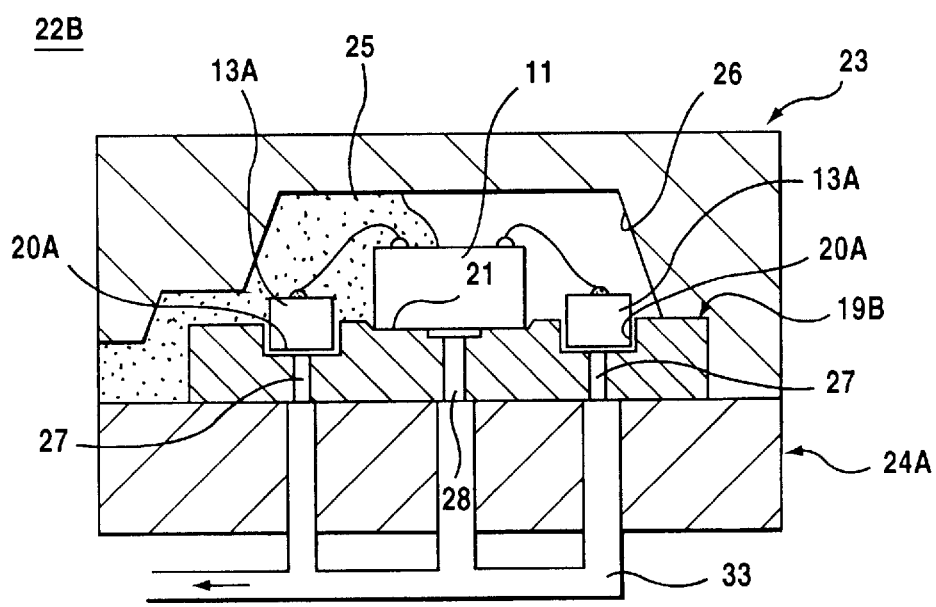
FIG. 11 is a schematic diagram showing a variant of the sealing process.

A variant according to the first embodiment of the method of manufacturing the semiconductor device will be described with reference to FIG. 10 and FIG. 11. FIG. 10 shows a connecting process according to the variant, and FIG. 11 shows a sealing process according to the variant.

In the variant, it is characterized in that electrode suction holes 27 and element suction holes 28 are formed in a holding board 19B. The electrode suction holes 27 are formed so as to match the electrode accommodation recesses 20A with their top ends opened at the base of the electrode accommodation recesses 20A and their bottom ends opened at the lower surface of the holding board 19B. The element suction holes 28 are formed so as to match the element accommodation recess 21 with its top end opened at the base of the element accommodation recess 21 and its bottom end opened at the lower surface of the holding board 19B.

In the connecting process according to the present variant, the holding board 19B is mounted on a heater block 30 as shown in FIG. 10. The heater block 30 heats the electrode members 13A via the holding board 19B, so that wire-bonding using a capillary 32 will be performed in a good condition. Also, since ultra-sound bonding is employed in the present embodiment, the holding board 19B is fixed to the heater block 30 by clamps 29.

The heater block 30 is provided with a suction tube 31 which communicates with the electrode suction holes 27 and the element suction holes 28. This suction tube 31 is connected to a suction device (not shown) which can be for example a vacuum pump. Therefore, when vacuum is created in the suction tube 31 by operating the suction device, the semiconductor element 11 is held by vacuum to the base of the element accommodation recess 21 and the electrode members 13A are held by vacuum to the base of the electrode accommodation recesses 20A. According to the present variant, the connecting process can be performed with the semiconductor chip 11 and the electrode members 13A held by vacuum to the holding board 19B.

An shown in FIG. 11, in the sealing process according to the present variant, a lower-mold 24A which forms a part of a mold 22B is provided with a suction tube 33 which communicates with the electrode suction holes 27 and the element suction holes 28 formed on the holding board 19B. This suction tube 33 is connected to a suction device (not shown) which can be for example a vacuum pump. Therefore, when vacuum is created in the suction tube 33 by operating the suction device, the semiconductor element 11 is held by vacuum to the base of the element accommodation recess 21 and the electrode members 13A are held by vacuum to the base of the electrode accommodation recesses 20A. According to the present variant, the sealing process can be performed with the semiconductor chip 11 and the electrode members 13A held by vacuum to the holding board 19B.

Thus, by performing the connecting process and the sealing process with the semiconductor chip 11 and the electrode members 13A held by vacuum to the holding board 19B, holding can be achieved without using extra material for holding the semiconductor chip 11 and the electrode members 13A (such as holders, herein referred to as foreign matter).

Because of this, the risk of impurities entering between the semiconductor chip 11 and the electrode members 13A and the holding board 19B is reduced. This decreases contamination, and reliability of the semiconductor device is improved. Also, a boundary surface between the foreign matter and the semiconductor element 11 and the electrode members 13A is reduced, so that peeling and/or cracking due to thermal stress at the boundary surface can be reduced. This also improves reliability of the semiconductor device.

In the following, a semiconductor device 10B of the second embodiment of the present invention and a method of manufacturing semiconductor device 10B is described.

Figure 12:
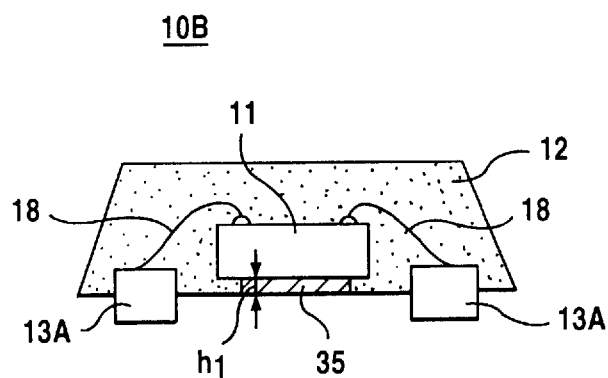
FIG. 12 is a cross sectional diagram of a second embodiment of a semiconductor device of the present invention.
Figure 13:
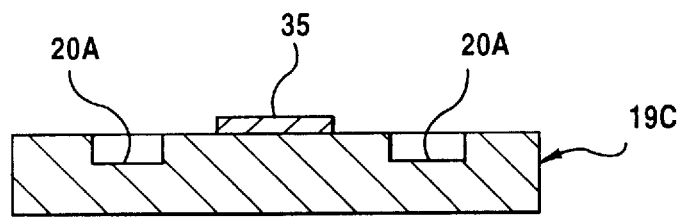
FIG. 13 is a schematic diagram showing a mounting process of a manufacturing method of a second embodiment of a semiconductor device of the present invention.
Figure 14:
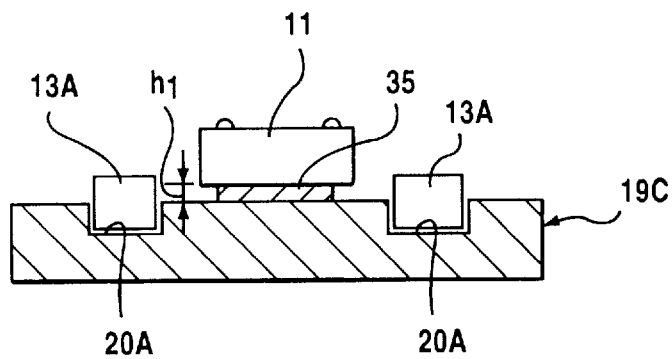
FIG. 14 is another schematic diagram showing amounting process of a manufacturing method of a second embodiment of a semiconductor device of the present invention.
Figure 15:
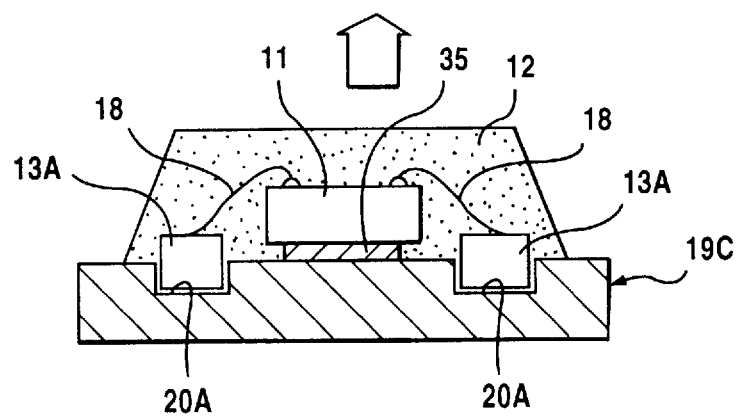
FIG. 15 a schematic diagram showing a separating process of a manufacturing method of a second embodiment of a semiconductor device of the present invention.

FIG. 12 shows the semiconductor device 10B of the second embodiment. FIGS. 13–15 are diagrams used to describe the manufacturing method of the semiconductor device 10B of the second embodiment. In FIGS. 13–15, components which are the same as those of FIGS. 4–11 used to describe the semiconductor device 10A according to the first embodiment and the method of manufacturing the semiconductor device 10A are indicated by same the reference number, and explanations are omitted.

The semiconductor device 10B according to the present embodiment is characterized in that a tape member 35 is provided on the lower surface of the semiconductor chip 11. This tape member 35 is for example applied with adhesive agent on both sides, and functions as an adhesive member. The tape member 35 has a predetermined thickness (indicated by an arrow hi in FIG. 12) and also functions as a spacer. In addition, the area of this tape member 35 is smaller than the area of the semiconductor chip 11. Therefore, there remains the area on the lower surface of the semiconductor chip 11 where the tape member 35 is not provided.

Now, the manufacturing method of the semiconductor 10B of the above structure will be explained. FIGS. 13 and 14 show the mounting process of the manufacturing method according to the second embodiment. In the present embodiment, the element accommodation recess 21 is not formed on a holding board 19C, and as shown in FIG. 13, the tape member 35 is provided at the position where the semiconductor chip 11 is mounted. Since the tape member 35 is a so-called double coated adhesive tape, as described above, the tape member 35 can be easily provided to the holding board 19C.

Subsequently, the semiconductor chip 11 and the electrode member 13A are mounted on the holding board 19C. Here, the semiconductor chip 11 is mounted on the tape member 35. Thus by holding the semiconductor chip 11 on the holding board 19C using the tape member 35 which functions as an adhesive member in the mounting process, the semiconductor chip 11 can be securely held to the holding board 19C.

As shown above, by providing the tape member 35 in the mounting process, this tape member 35 functions as a spacer, so that the semiconductor chip 11 can be mounted on the holding board 19C with a distance of the thickness (h1) of the tape member 35 apart from the surface of the holding board 19C. Also, the area of the tape member 35 is smaller than the area of the semiconductor chip 11. Therefore, as shown in FIG. 14, a space can be formed between the base of the semiconductor chip 11 and the surface of the holding board 19C.

FIG. 15 shows the sealing process according to the present embodiment. By forming a space between the base of the semiconductor chip 11 and the surface of the holding board 19C, the sealing resin 25 is also loaded in this space when the resin package 12 is formed in the sealing process. Because of this, the base of the semiconductor chip 11 is such that it is covered with the tape member 35 and the resin package 12.

The semiconductor device 10B which is manufactured as above has a structure wherein the base of the semiconductor chip 11 is such that it is covered with the tape member 35 and the resin package 12, so that when this semiconductor device 10B is mounted on the mounting board, the semiconductor chip 11 and the mounting board are prevented from being short-circuited. Also because the resin package surrounds the lower surface of the semiconductor chip 11, the semiconductor chip 11 is prevented from being separated from resin package 12. This may improve the reliability of the semiconductor device.

In the following, a semiconductor device 10C of the third embodiment of the present invention and a method of manufacturing the semiconductor device 10C is described.

Figure 16:
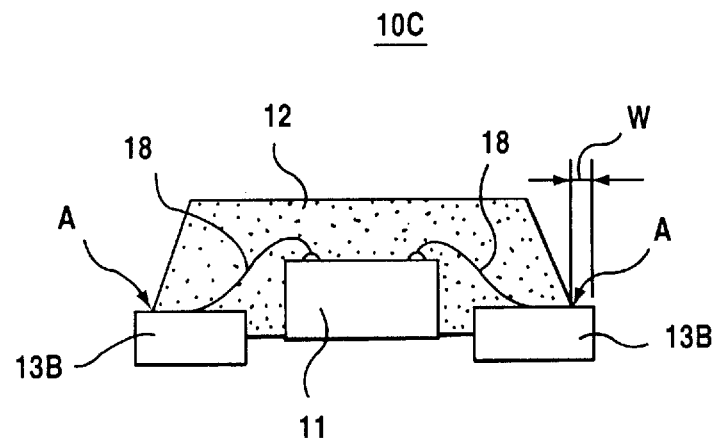
FIG. 16 is a cross sectional diagram of a third embodiment of a semiconductor device of the present invention.
Figure 17:
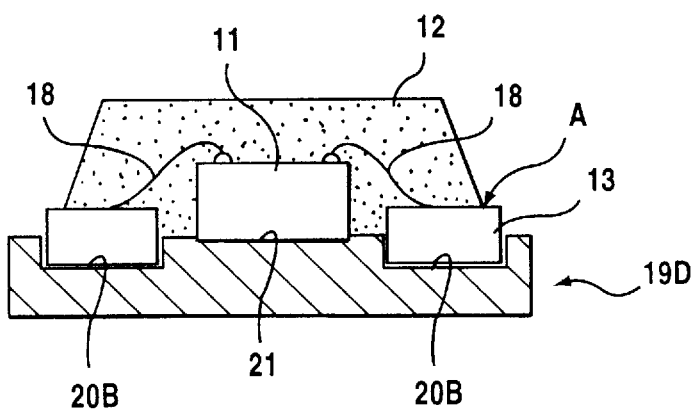
FIG. 17 is a schematic diagram showing a completion state of a sealing process of a manufacturing method of a third embodiment of a semiconductor device of the present invention.
Figure 18:
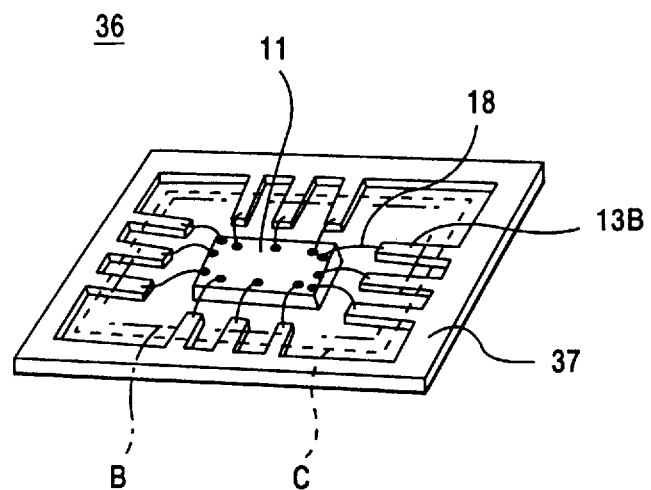
FIG. 18 is a schematic diagram showing a lead frame which can be applied in a manufacturing method of a third embodiment of a semiconductor device of the present invention.

FIG. 16 shows the semiconductor device 10C of the third embodiment. FIGS. 17 and 18 are diagrams used to describe the manufacturing method of the semiconductor device 10C of the third embodiment. In FIGS. 16–18, components which are also the same as those of FIGS. 4–11 used to describe the semiconductor device 10A according to the first embodiment and the method of manufacturing the semiconductor device 10A are indicated by the same reference number, and explanations are omitted.

The semiconductor device 10C according to the present embodiment is characterized in that electrode members 13B are extended outside the outer edge (indicated by an arrow A in FIG. 16) of the resin package 12. In an example shown in FIG. 16, the electrode members 13B are extended outside the outer edge of the resin package 12 by a width W.

By extending the electrode members 13B outside the outer edge A of the resin package 12, a test can be carried with at by touching this extended part with a probe. Because of this, an operational test can be carried out for the semiconductor device 10C after the semiconductor device 10C is mounted on the mounting board.

Now, the manufacturing method of the semiconductor device 10C of the above structure will be described. FIGS. 17 and 18 show the mounting process of the manufacturing method according to the second embodiment. The manufacturing method shown in FIG. 17 is characterized in that the size of electrode accommodation recesses 20B formed on a holding board 19D is larger than the size of the electrode accommodation recesses 20A of each of the above described embodiments.

That is to say, the electrode accommodation recesses 20B are extended more than the electrode accommodation recesses 20A of each of the above described embodiments, so that they extend outside the outer edge A of the resin package 12. By using the holding board 19D, on which the electrode accommodation recesses 20B of above structure are formed, the semiconductor device 10C can be manufactured by using manufacturing processes similar to those of the above described embodiments.

Since the semiconductor device 10C is constructed such that the electrode members 13B extend outside the outer edge A of the resin package, the semiconductor device 10C can be manufactured by using lead-frame 36 which is shown in FIG. 18. This lead-frame 36 includes a frame body 37 which is larger than the outer edge (indicated in dash-dot line) of the resin package 12 and the electrode members 13B integrated in this frame body 37.

After connecting the semiconductor chips 11 to the lead-frame by the wires 18, the resin package is formed by performing the sealing process. When the sealing process is complete, the part within a dash-dot line B is sealed in the resin package 12. Therefore, when the sealing process is complete, a part of the electrode members 13B and the frame body 37 are placed outside the resin package 12.

Subsequently, the frame body 37 is removed by cutting the lead-frame 36 along a dash-dot line C. Because of this, a part of the electrode members 13B extends outside the resin package 12, and the semiconductor device 10C shown in FIG. 16 is manufactured. By manufacturing the semiconductor device 10C using the lead-frame 36, existing semiconductor manufacturing equipment can be utilized while improving manufacturing efficiency.

In the following, a semiconductor device 10D of the fourth embodiment of the present invention and a method of manufacturing the semiconductor device 10D is described.

Figure 19:
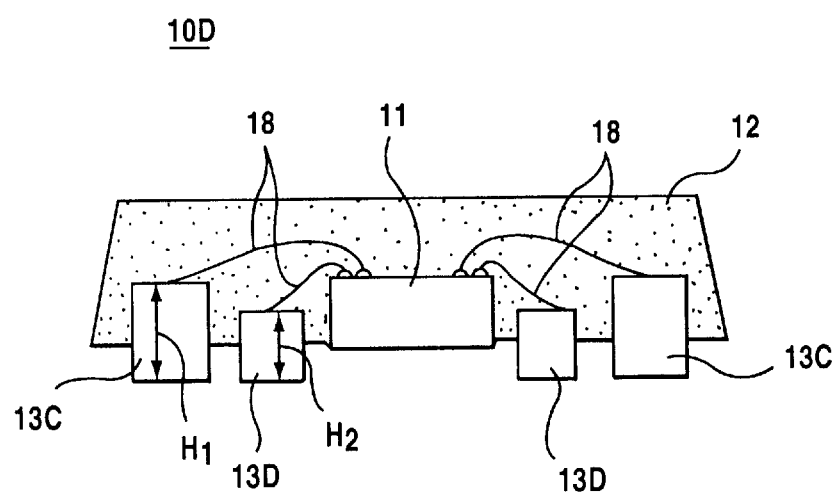
FIG. 19 is a cross sectional diagram of a fourth embodiment of a semiconductor device of the present invention.
Figure 20:
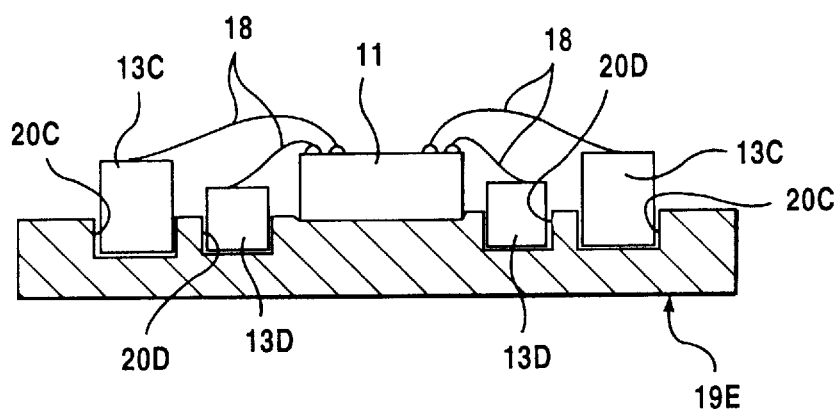
FIG. 20 is a schematic diagram showing a connecting process of a manufacturing method of a fourth embodiment of a semiconductor device of the present invention.

FIG. 19 shows the semiconductor device 10D of the fourth embodiment. FIG. 20 is a diagram used to describe the manufacturing method of the semiconductor device 10D of the fourth embodiment. In FIGS. 19 and 20, components which are the same as those of FIGS. 4–11 used to describe the semiconductor device 10A according to the first embodiment and the method of manufacturing the semiconductor device 10A are indicated by the same reference number, and explanations are omitted.

A semiconductor device 10D according to the present embodiment is characterized in that electrode members include high-back electrode members 13C (having height indicated as H1 in FIG. 19) and low-back electrode members 13D (having a height indicated as H2 in FIG. 19) having a height lower than the height of the high-back electrode members 13C.

As shown in FIG. 19, the low-back electrode members 13D are provided on the inner periphery which is nearer to the semiconductor chip 11 and the high-back electrode members 13C are provided at the outer periphery so as to surround the low-back electrode members 13D. Thus, by constructing the electrode members with the high-back electrode members 13C and the low-back electrode members 13D, the pitch between respective electrode members 13C and 13D can be narrowed, so that the semiconductor device 10D can be a multi-pin structure.

FIG. 20 show a connecting process of the manufacturing process of the semiconductor device 10D of above structure. As shown in FIG. 20, the depth of first electrode accommodation recesses 20C for the high-back electrode members 13C and the depth of second electrode accommodation recesses 20E for the low-back electrode members 13D which are formed in a holding board 19E are assumed to be equal. Therefore in the mounting process, when the high-back electrode members 13C are mounted on the first electrode accommodation recesses 20C and the low-back electrode members 13D are mounted on the second electrode accommodation recesses 20E, the degree of protrusion of each of the electrode members 13C and 13D above the holding board 19E will be such as shown in FIG. 20.

In the connecting process, wires 18 are connected with the high-back electrode members 13C and the low-back electrode members 13D of different heights, so that a so-called multi-stage bonding can be performed. By enabling multi-stage bonding, neighboring wires 18 are prevented from touching each other, thus a fine-pitch structure and a multi-pin structure is achieved.

Now, the variant of a electrode member will be described. FIGS. 21A–21D show various types of the variant of the electrode member.

Figure 21A:
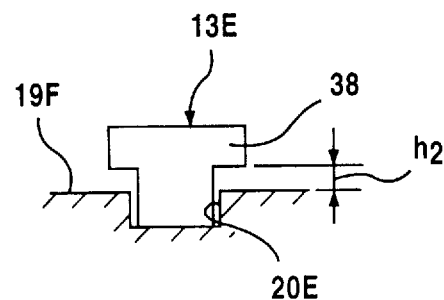
FIGS. 21A–D are diagrams showing variant embodiments of electrode members.

FIG. 21A shows an electrode member 13E. The electrode member 13E is characterized in that a flange 38 is formed on its upper part and that the flange 38 forms a predetermined space (indicated by H2 in FIG. 21A) with the upper surface of a holding board 19F when an electrode member 13E is mounted on an electrode accommodation recess 20E formed in the holding board 19F.

When the sealing process is performed to the electrode member 13E of the above structure, the sealing resin 25 forming the resin package 12 is also filled below the flange 38, resulting in increase of the joining strength between the electrode member 13E and the resin package 12. Therefore, according to the present embodiment, the electrode member 13E is prevented from remaining in the holding board 19F during the separating process.

Figure 21B:
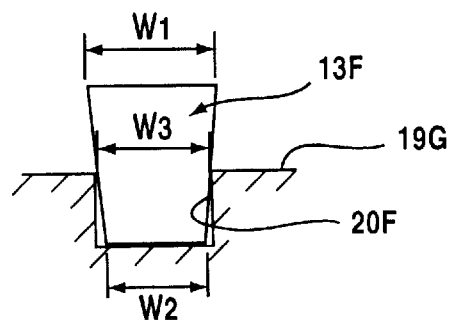
Figure 21C:
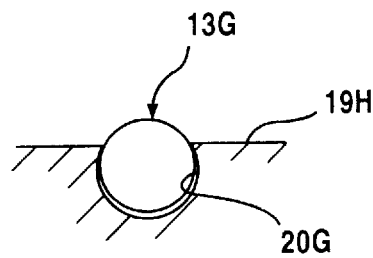
Figure 21D:
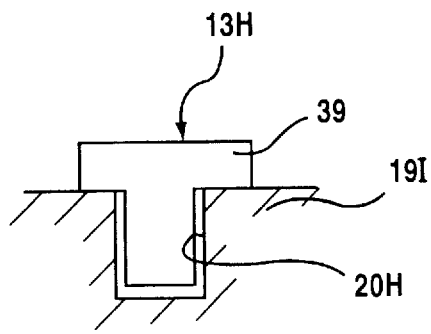

Electrode members 13F–13H shown in FIGS. 21B–21D are electrode members having an improved adhesiveness with respective electrode accommodation recesses 20F–20H. As described above, when the sealing resin 25 enters between the electrode members 13F–13H and the electrode accommodation recesses 20F–20H, the sealing resin 25 acts as an adhesive agent, thereby preventing the electrode members 13F–13H from separating from the electrode accommodation recesses 20F–20H during the separating process. However, by improving adhesiveness between the electrode members 13F–13H and the electrode accommodation recesses 20F–20H, entry of the sealing resin 25 is prevented and the separating process is smoothly carried out. Each of the electrode members 13F–13H will be described in the following.

FIG. 21B shows an electrode member 13F. The electrode member 13F is characterized in that the size of its upper part (indicated by an arrow W1 in FIG. 21A) is larger than the size of its lower part (indicated by an arrow W2 in FIG. 21A) and that the size gradually decreases from its upper part towards its lower part. The size of the upper part W1 is larger than the size of the electrode accommodation recess 20F (indicated by an arrow W3 in FIG. 21A) formed in a holding board 19G, and the size of the lower part W2 is smaller than the size of the electrode accommodation recess 20F (W1<W3<W2).

Since the periphery of the electrode member 13F always touches the electrode accommodation recess 20F by employing the above structure, adhesiveness between the electrode member 13F and the electrode accommodation recess 20F is improved.

FIG. 21C shows an electrode member 13G. The electrode member 13G is characterized in that it is spherical and that the shape of the electrode accommodation recess 20G formed in a holding board 19H is substantially spherical so as to match the shape of the electrode member 13G. At an upper part of the electrode accommodation recess 20G, there is formed a hole having a smallest possible dimension for permitting the insertion of the electrode member 13G. Therefore the electrode member 13G will be mounted on the electrode accommodation recess 20G by pressing it into the electrode accommodation recess 20G. Because of this, the adhesiveness between the electrode member 13G and the electrode accommodation recess 20G is improved.

FIG. 21D shows an electrode member 13H. The electrode member 13H is characterized in that a flange 39 is formed at its upper part and that the flange 39 touches the upper surface of a holding board 19I when an electrode member 13H is mounted on the electrode accommodation recess 20H formed in the holding board 19I. By employing this structure, the flange 39 functions as a plug which blocks the electrode accommodation recess 20H. Therefore, the adhesiveness between the electrode member 13H and the electrode accommodation recess 20H is also improved by this structure.

Further, the present invention is not limited to these embodiments, but variations and modifications may be made without departing from the scope of the present invention.

What is claimed is:

1. A method of manufacturing a semiconductor device comprising the steps of:

a) mounting a semiconductor chip on a holding board having electrode accommodation recesses formed thereon, and mounting electrode members to said electrode accommodation recesses, said electrode members being separate from said semiconductor chip;

b) electrically connecting electrode pads formed on said semiconductor chip with said electrode members;

c) forming a resin package for sealing said semiconductor chip on said holding board by using a die, said holding board serving as a part of said die; and d) separating said resin package including said electrode members from said holding board.

2. The method as claimed in claim 1, wherein said step a) further comprises the steps of:

forming an element accommodation recess together with said electrode accommodation recesses on said holding board for carrying said semiconductor chip; and mounting said semiconductor chip on said element accommodation recess so that said holding board holds said semiconductor chip.

3. The method as claimed in claim 1, wherein said step a) further comprises the steps of:

providing an adhesion member having adhesiveness to said holding board at a position where said semiconductor chip is be mounted; and holding said semiconductor chip on said holding board by said adhesion member.

4. The method as claimed in claim 3, including providing an area of said adhesive member which is smaller than an area of said semiconductor chip.

5. The method as claimed in claim 1, further comprising a step of forming suction holes in said holding board so that both of said step b) and said step c) are performed while said semiconductor chip and said electrode members are held to said holding board by suction force.

6. The method as claimed in claim 1, wherein before performing said step a), a plating process is performed for at least partly forming plating layers on said electrode members.

7. The method as claimed in claim 6, including forming said plating layers in said plating process of gold.

8. The method as claimed in claim 6, including forming said plating layers in said plating process of solder.

9. The method as claimed in claim 1, further comprising a step of applying, before performing said step a), a demolding agent to a portion of said holding board where said holding board comes in contact with said resin package, for weakening adhesiveness against a resin of said resin package.

10. The method as claimed in claim 1, including applying gold plating to a portion of said holding board where said holding board comes in contact with said resin package.

11. The method as claimed in claim 2, including providing a depth of said electrode accommodation recesses to be larger than a depth of said element accommodation recess of said holding board.

12. The method as claimed in claim 1, wherein, before performing said step a), performing an electrode member forming process in which said electrode members are formed by cutting out a metal plate.

13. The method as claimed in claim 1, including forming said electrode members used in said step a) from one of solder and gold.

14. The method as claimed in claim 1, including, in said step a), mounting said electrode members at different heights, so that connecting performed in said step b) is performed at different heights.

15. The method as claimed in claim 1, including providing for said electrode members and said electrode accommodation recesses to be adhered together when said electrode members are mounted on said electrode accommodation recesses in said step a).

16. The method as claimed in claim 1, including using any one of wire-bonding parts, TAB (Tape Automated Bonding), and flip-chip-bonding in said step b) for electrically connecting said electrode pads.

* * * * *

UNITED STATES PATENT AND TRADEMARK OFFICE
CERTIFICATE OF CORRECTION

PATENT NO.:     5,891,758
DATED     :     April 6, 1999
INVENTOR(S):    HONDA et al.

It is certified that an error appears in the above-identified patent and that said Letters Patent is hereby corrected as shown below:

On the title page: Item [73] "Fujitsu Limited, Ltd." should be --Fujitsu Limited--.

Signed and Sealed this

Thirteenth Day of March, 2001

NICHOLAS P. GODICI

Attest:

Attesting Officer

Acting Director of the United States Patent and Trademark Office